(12) United States Patent
Lee et al.

(10) Patent No.: US 9,362,504 B2
(45) Date of Patent: Jun. 7, 2016

(54) METHOD FOR MANUFACTURING DISPLAY PANEL

(71) Applicant: Samsung Display Co., Ltd., Yongin, Gyeonggi-Do (KR)

(72) Inventors: Hong Ro Lee, Seongnam-si (KR); Beung Hwa Jeong, Cheonan-si (KR); Sung Hoon Hong, Seoul (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 0 days.

(21) Appl. No.: 14/327,175

(22) Filed: Jul. 9, 2014

(65) Prior Publication Data

US 2015/0140705 A1   May 21, 2015

(30) Foreign Application Priority Data

Nov. 20, 2013 (KR) .......................... 10-2013-0141610

(51) Int. Cl.
*H01L 51/56* (2006.01)
*H01L 51/00* (2006.01)

(52) U.S. Cl.
CPC ................................... *H01L 51/003* (2013.01)

(58) Field of Classification Search
None
See application file for complete search history.

(56) References Cited

U.S. PATENT DOCUMENTS

| 6,861,136 | B2 | 3/2005 | Verlinden et al. |
| 8,033,882 | B2 | 10/2011 | Tsukahara et al. |
| 2003/0230114 | A1 | 12/2003 | Minamikawa |
| 2005/0001201 | A1 | 1/2005 | Bocko et al. |
| 2005/0136625 | A1 | 6/2005 | Henseler et al. |
| 2007/0020395 | A1* | 1/2007 | Lang ................... H01L 51/0003 427/256 |
| 2011/0026236 | A1 | 2/2011 | Kondo et al. |
| 2011/0045239 | A1 | 2/2011 | Takaya et al. |
| 2012/0038022 | A1 | 2/2012 | Tomiyasu et al. |

FOREIGN PATENT DOCUMENTS

| JP | 2006-140323 A | 6/2006 |
| KR | 10-2005-0003252 A | 1/2005 |
| KR | 10-2006-0041206 A | 5/2006 |
| KR | 10-2011-0007134 A | 1/2011 |
| WO | 2010079688 A | 7/2010 |

OTHER PUBLICATIONS

G. Kalkowski, M Rohde, S. Risse, R. Eberhardt, and A. Tunnermann, "Direct Bonding of Glass Substrates", ECS Transactions, vol. 33, Issue 4, pp. 349-355 (2010), The Electrochemical Society.

* cited by examiner

*Primary Examiner* — Alexander Ghyka
(74) *Attorney, Agent, or Firm* — Robert E. Bushnell, Esq.

(57) ABSTRACT

A method for manufacturing a display panel, including defining a desorbing area of a support substrate by forming one of a release layer or a recess portion in the desorbing area, cleaning a surface of the support substrate, disposing a thin film substrate on the support substrate, directly bonding, in an adsorbing area external to the desorbing area, the thin film substrate to the support substrate, forming a pixel and a sealing member on the thin film substrate, cutting the sealing member and the thin film substrate at a location that corresponds to the desorbing area, and separating the support substrate from the thin film substrate.

19 Claims, 13 Drawing Sheets

METHOD FOR MANUFACTURING DISPLAY PANEL

CLAIM OF PRIORITY

This application claims priority to and the benefit of Korean Patent Application No. 10-2013-0141610 filed in the Korean Intellectual Property Office on Nov. 20, 2013, the entire contents of which are incorporated herein by reference.

BACKGROUND OF THE INVENTION

1. Field of the Invention

The described technology relates generally to a method for manufacturing a display panel.

2. Description of the Related Art

Recently, the display device market has been rapidly changing to a flat panel display (FPD) market because the FPDs may be easily implemented to be large, thin, and lightweight. Among various types of flat panel displays, an organic light emitting diode (OLED) display is a self-emitting type without a separate light source and therefore is more advantageous in thinness and weight reduction.

Since a general flat panel display uses a glass substrate, the flat panel display has reduced flexibility, a thick thickness, and a heavy weight, and therefore is limited in applications. Recently, to reduce the thickness of the display device, display units are being formed on an ultrathin glass substrate.

The ultrathin glass substrate has a thin thickness and a large area, and therefore is not easy to handle. Therefore, a support substrate is attached beneath the ultrathin glass substrate in order to form a pixel on the ultrathin glass substrate.

However, after the pixel formation process is completed, the ultrathin glass substrate needs to be separated from the support substrate. In order to do so, the ultrathin glass substrate is exposed to a high temperature process and the like, and therefore may not be easily separated from the support substrate and may be partially damaged.

The above information disclosed in this Background section is only for enhancement of understanding of the background of the described technology, and therefore it may contain information that does not constitute prior art as per 35 U.S.C. §102.

SUMMARY OF THE INVENTION

Therefore, the present invention has been made in an effort to provide a method for manufacturing a display panel capable of easily separating an ultrathin glass substrate from a support substrate.

According to one aspect of the present invention, there is provided a method of manufacturing a display panel, including defining a desorbing area in a support substrate by forming one of a release layer and a recess portion in the desorbing area of the support substrate, cleaning a surface of the support substrate, disposing a thin film substrate on the support substrate, bonding the thin film substrate to the support substrate, forming a pixel and a sealing member on the thin film substrate, cutting the sealing member and the thin film substrate at a location that corresponds to the desorbing area and separating the support substrate from the thin film substrate. The cleaning may be achieved by one of UV cleaning, ultrasonic wave cleaning, waterjet cleaning, hydrogen water cleaning, and ozone ($O_3$) cleaning. The pixel may include an organic light emitting element.

The desorbing area may be defined by the recess portion, the recess portion being produced by plasma etching or sandblasting. A depth of the recess portion may be 2 nm to 200 μm. The desorbing area may be defined by the release layer, the forming of the release layer may include forming one of an indium tin oxide (ITO) layer and an indium zinc oxide (IZO) layer on the support substrate, forming a reserved release layer by patterning the one of the ITO layer and the IZO layer and crystallizing the reserved release layer. The release layer may be formed to have a thickness of 100 Å to 1,000 Å.

The thin film substrate may include an ultrathin glass having a thickness of 0.01 mm to 0.1 mm. A surface roughness of the support substrate at a location corresponding to an adsorbing area external to the desorbing area may be equal to or less than 0.2 nm. During the bonding, the thin film substrate may be directly and covalently bonded to the support substrate in the adsorbing area without an intervening adhesive layer.

According to another aspect of the present invention, there is provided another method of manufacturing a display panel, including cleaning a surface of a support substrate, defining a desorbing area of the support substrate by forming one of a release layer and a recess portion in the desorbing area of the support substrate, disposing a thin film substrate on the support substrate, bonding the thin film substrate to the support substrate, forming a pixel and a sealing member on the thin film substrate, cutting the sealing member and the thin film substrate at a location that corresponds to the desorbing area and separating the support substrate from the thin film substrate. The cleaning may include a process selected from UV cleaning, ultrasonic wave cleaning, waterjet cleaning, hydrogen water cleaning, and ozone ($O_3$) cleaning, and the thin film substrate may be directly and covalently bonded to the support substrate in an adsorbing area external to the desorbing area and without an intervening adhesive layer. The support substrate may also include an adsorbing area surrounding the desorbing area.

The desorbing area may be defined by the recess portion, the recess portion may be produced by etching the support substrate via a process selected from a group consisting of plasma etching and sandblasting. A depth of the recess portion may be 2 nm to 200 μm.

The desorbing area may be defined by the release layer, the forming of the release layer may include forming one of an indium tin oxide (ITO) layer and an indium zinc oxide (IZO) layer on the support substrate, forming a reserved release layer by patterning the one of the ITO layer and the IZO layer and crystallizing the reserved release layer. The release layer may be formed to have a thickness of 100 Å to 1000 Å.

The thin film substrate may be an ultrathin glass having a thickness of 0.01 mm to 0.1 mm. A surface roughness of the support substrate at a location corresponding to an adsorbing area external to the desorbing area may be equal to or less than 0.2 nm. The pixel may include an organic light emitting element.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
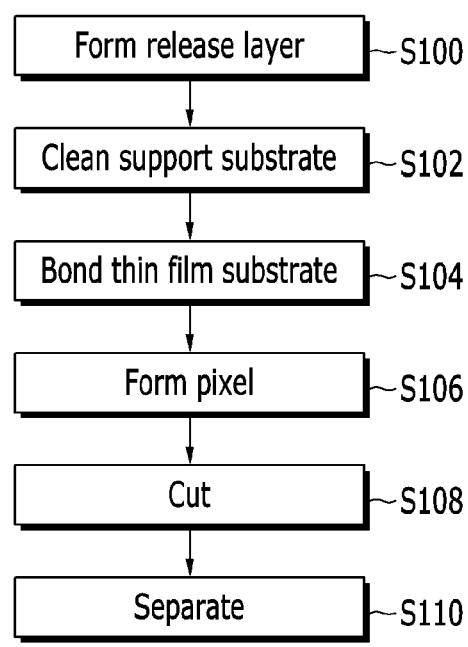
FIG. 1 is a flowchart illustrating a method for manufacturing a display panel according to a first exemplary embodiment of the present invention.

Hereinafter, the exemplary embodiment will be described more fully with reference to the accompanying drawings, in which exemplary embodiments are shown. As those skilled in the art would realize, the described embodiments may be modified in various different ways, all without departing from the spirit or scope of the present invention.

In the drawings, the thickness of layers, films, panels, regions, etc., are exaggerated for clarity. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Turning now to FIG. 1, FIG. 1 is a flowchart illustrating a method for manufacturing a display panel according to an exemplary embodiment. As illustrated in FIG. 1, a method for manufacturing a display panel according to an exemplary embodiment includes forming a desorbing area and an adsorbing area on a support substrate (S100), cleaning the support substrate (S102), bonding a thin film substrate onto the support substrate (S104), forming a pixel on the thin film substrate (S106), cutting the thin film substrate into individual display panels (S108), and separating the display panel from the support substrate (S110).

Hereinafter, the method for manufacturing a display panel according to the flowchart of FIG. 1 will be described in detail with reference to FIGS. 2 to 5.

Figure 4:
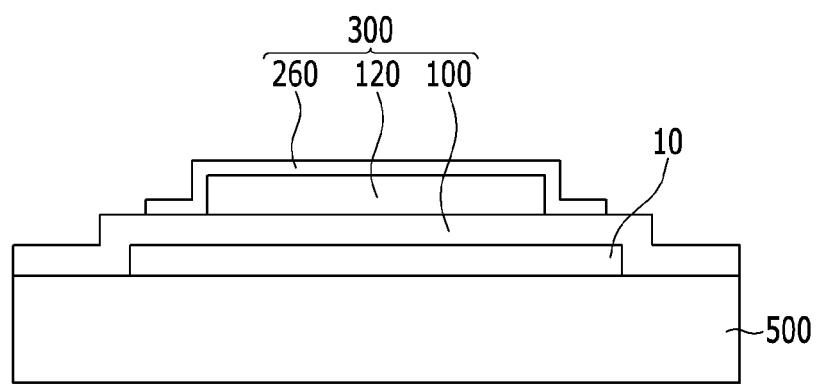
FIG. 4 illustrates a process step where a pixel is formed on the thin film substrate attached to the support substrate according to the method of the first exemplary embodiment.
Figure 5:
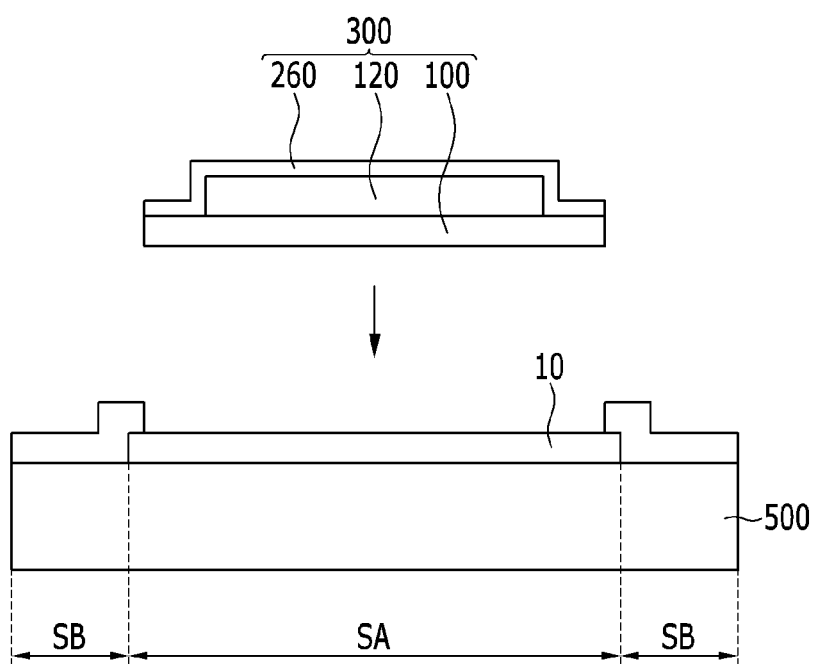
FIG. 5 illustrates a process step where the display panel including the pixel and a portion of the thin film substrate are separated from the support substrate according to the method of the first exemplary embodiment.
Figure 6:
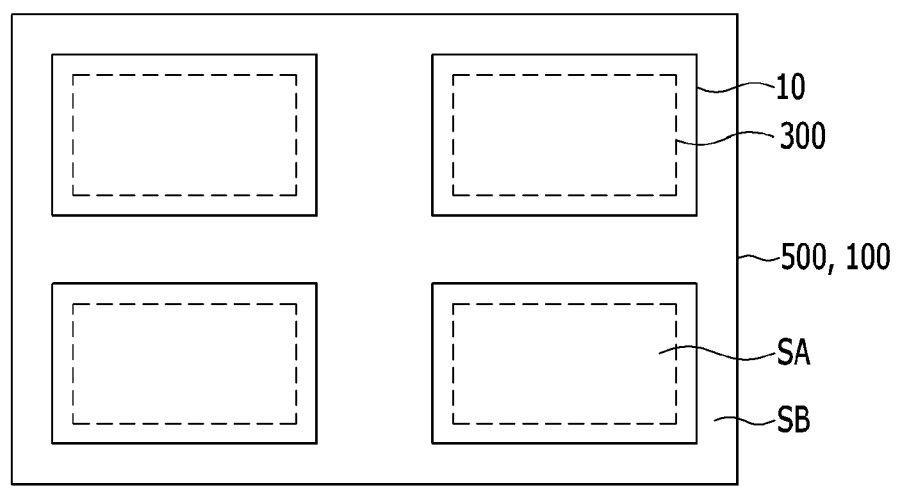
FIG. 6 is a schematic layout view of a display panel in a mother substrate according to an exemplary embodiment of the present invention.

FIGS. 2 to 5 are cross-sectional views schematically describing the method for manufacturing a display panel according to the first exemplary embodiment, and FIG. 6 is a schematic layout view of a display panel in a mother substrate according to the first exemplary embodiment.

Figure 2:
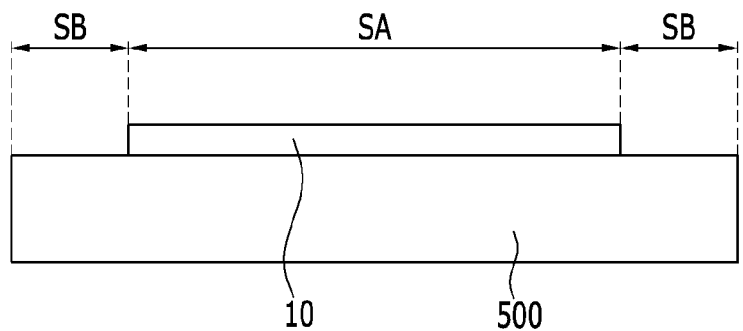
FIG. 2 illustrates a process step where a release layer is added to a desorbing area SA of the support substrate according to the method of the first exemplary embodiment.

As illustrated in FIGS. 1 and 2, a support substrate 500 is prepared and a release layer 10 is formed on the support substrate 500 (S100) to differentiate a desorbing area SA from an adsorbing area SB.

The support substrate 500 supports the thin film substrate 100 and prevents the thin film substrate from warping, which would otherwise occur because the thin film substrate, often made out of a glass substrate, is very thin. The support substrate 500 may have a thickness of 0.3 mm to 1 mm, and may preferably have a thickness of 0.5 mm.

The desorbing area SA is a region in which the release layer 10 is formed, and the adsorbing area SB is a region in which the release layer 10 is not formed. As illustrated in FIG. 6, the release layer may be formed in plural and disposed in a matrix form.

For the release layer, an indium tin oxide (ITO) film or an indium zinc oxide (IZO) film is first formed to a thickness of 100 Å to 1000 Å at a temperature of 200° C. or less. Next, a reserved release layer is formed by patterning the ITO film or the IZO film using a photolithography process.

In this case, the ITO film is an amorphous thin film, and since the ITO film may be coupled to the thin film substrate by reacting with the thin film substrate at the time of undergoing a subsequent heat treatment, the amorphous ITO film is polycrystallized by being heat-treated at a temperature of 400° C. for 30 minutes. When the amorphous ITO film is crystallized, a surface roughness of the ITO film is increased to minimize a contact area with the thin film substrate 100, and thus the ITO film does not couple to the thin film substrate even though the ITO film undergoes a subsequent heat treatment.

Compared to the ITO film, the IZO film has relatively less reactivity with the thin film substrate and does not need to undergo the crystallization process, but is crystallized and thus may be more easily detached.

Next, the support substrate 500 is cleaned (S102). The cleaning removes organic material on a surface of the substrate 500, and exposed portions of the substrate 500 corresponding to the adsorbing area SB become hydrophilic by attaching an OH group onto the surface thereof.

For the cleaning process, UV cleaning, ultrasonic wave cleaning, waterjet cleaning, hydrogen water cleaning, ozone ($O_3$) cleaning, and the like may be performed. The UV cleaning may be performed at a wavelength of 172 nm for 65 seconds, the ultrasonic wave cleaning may be performed at a power of 600 W, the waterjet cleaning may be performed at a pressure of 90 bar and at a specific resistance value of 0.8 MΩ, and the ozone cleaning may be performed for 55 seconds when an ozone concentration is 25 ppm.

Figure 3:
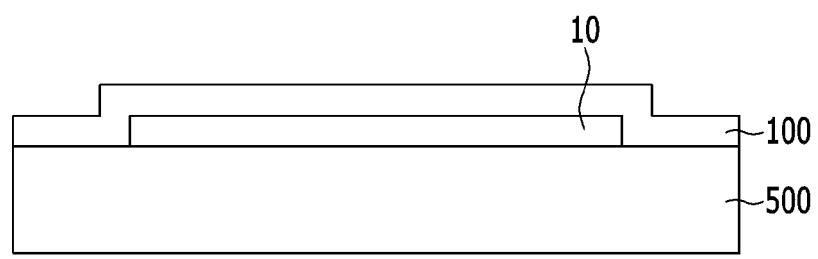
FIG. 3 illustrates a process of where a thin film substrate is attached to the support substrate/release layer combination according to the method of the first exemplary embodiment.

Next, as illustrated in FIGS. 1 and 3, a thin film substrate 100 is disposed on the support substrate 500 to contact the support substrate 500, and is then bonded to the support substrate 500 (S104). The thin film substrate 100 is thinner than the support substrate 500, and may be an ultrathin glass substrate having a thickness of 0.01 mm to 0.1 mm. The bonding is performed in a vacuum state of 10E-1 torr or less, or may be performed at a temperature of 250° C. or more for 10 minutes. In addition, a compressive force may also be applied between the thin film substrate and the support substrate to form the bond.

The support substrate 500 and portions of the thin film substrate 100 that are located at the attaching area SB at the time of the direct bonding contact each other and thus are chemically coupled with each other. Portions of the thin film substrate 100 located in the desorbing area SA are physically coupled to the release layer 10 by contacting the release layer 10.

That is, oxygen (O) attached to the support substrate 500 and the thin film substrate 100 as a result of the cleaning, and then Si of the substrates are covalently bonded through the oxygen (O), such that the support substrate 500 and the thin film substrate 100 are strongly coupled to each other.

However, in the desorbing area SA, the release layer 10 does not include Si, and therefore covalent bonding does not occur. In the desorbing area SA, the release layer 10 and the thin film substrate 100 are physically coupled to each other, such that the thin film substrate 100 and the support substrate 500 are more weakly coupled than in the adsorbing area SB. FIG. 3 illustrates thin film substrate 100 mounted on support substrate 500 with release layer 10 formed thereon, however in FIG. 3, the thickness of the release layer 10 is grossly exaggerated to recite the structure, and it is to be appreciated that the thickness of the release layer 10 is very thin (100 Å to 1000 Å thick), so that a top surface of the release layer 10 is nearly flat.

Meanwhile, the thin film substrate 100 may be a mother substrate on which the display panel 300, including a plurality of pixels for an organic light emitting display panel or a liquid crystal display panel, are formed in plural, and each display panel 300 is located within a boundary line of a corresponding desorbing area SA. In this case, as illustrated in FIG. 6, the support substrate 500 may be provided with the plurality of desorbing areas SA corresponding to a plurality of release layers 10, and may be disposed in a matrix form. Therefore, the adsorbing area SB is located between the neighboring desorbing areas SA, such that the desorbing areas SA is surrounded by the adsorbing area SB.

When the desorbing area SA is formed to be biased to one side of the support substrate 500 and thus the adsorbing area SB does not surround the desorbing area SA, or only the desorbing area SA is formed over the whole of the support substrate 500, since the release layer 10 is present between the thin film substrate 100 and the support substrate 500, a peeling phenomenon may occur between the two substrates. Therefore, the adsorbing area SB is formed to surround the desorbing area SA to prevent the thin film substrate 100 and the support substrate 500 from separating from each other.

Meanwhile, the surface roughness of the adsorbing area SB of the support substrate 500 may be 0.2 nm or less. When the surface roughness of the adsorbing area SB exceeds 0.2 nm, the peeling phenomenon may occur due to air bubbles, even though the adsorbing area SB becomes hydrophilic by the cleaning.

Next, as illustrated in FIGS. 1 and 4, a plurality of pixels 120 of the organic light emitting display panel are formed on the thin film substrate 100. The pixel structure will be now described in detail with reference to FIGS. 7 to 9.

Figure 7:
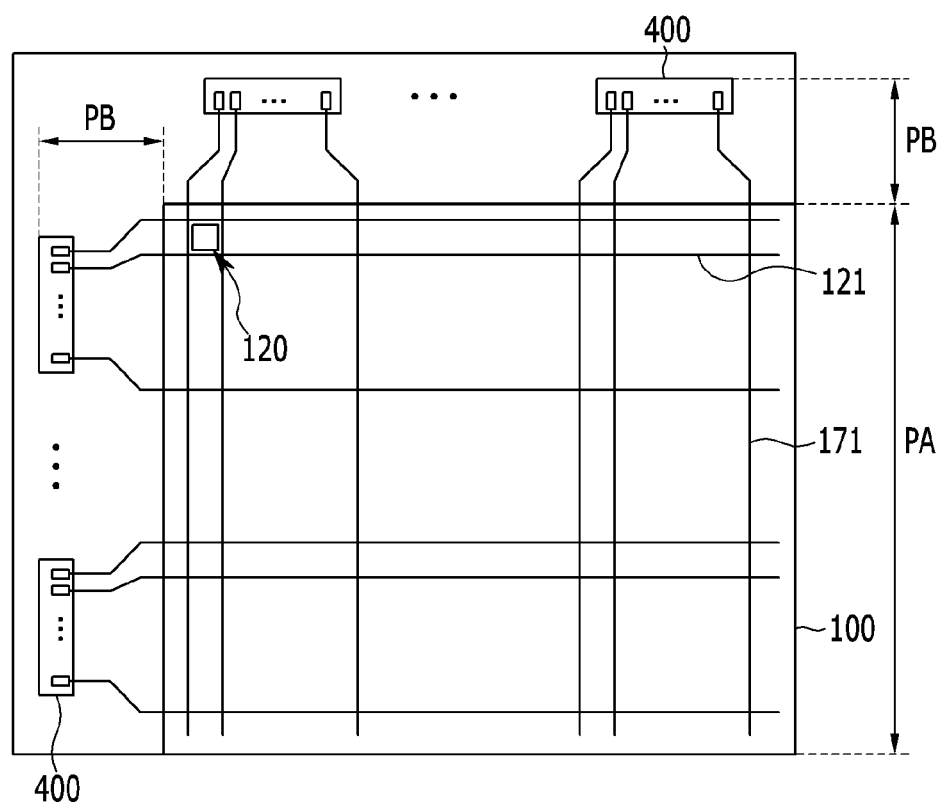
FIG. 7 is a schematic layout view of an organic light emitting display panel according to an exemplary embodiment of the present invention.

FIG. 7 is a schematic layout view of the organic light emitting display panel according to the exemplary embodiment. Referring to FIG. 7, the pixel 120 of the organic light emitting display panel is formed on the thin film substrate 100 and may be disposed in a matrix form.

The organic light emitting display panel is formed on the thin film substrate 100, and includes a display unit PA which includes the plurality of pixels, and a driver PB which includes a driving circuit connected to the pixels.

The display unit PA is formed in one direction and includes a first signal line 121 which transfers a scanning signal, a second signal line 171 which intersects the first signal line 121 and transfers a data signal, and the pixels 120 which are disposed in a matrix form, are connected to the first signal line 121 and the second signal line 171 to display images. The pixel may be connected to various additional signal lines to which other signals may be applied, in addition to the first signal line and the second signal line.

The pixel 120 includes thin film transistors and organic light emitting elements which receive the signals from the first signal line 121 and the second signal line 171 to display images. The organic light emitting element is controlled by the driver PB and emits light depending on the driving signal to display an image.

The driver PB includes driving circuits 400 that are each connected to the first signal line 121 or the second signal line 171 to transfer external signals. The driving circuit 400 is mounted on the thin film substrate in an IC chip form, or may be integrated on the thin film substrate 100 along with the thin film transistor of the display unit.

One pixel of the organic light emitting display panel will be described in more detail with reference to FIG. 8.

Figure 8:
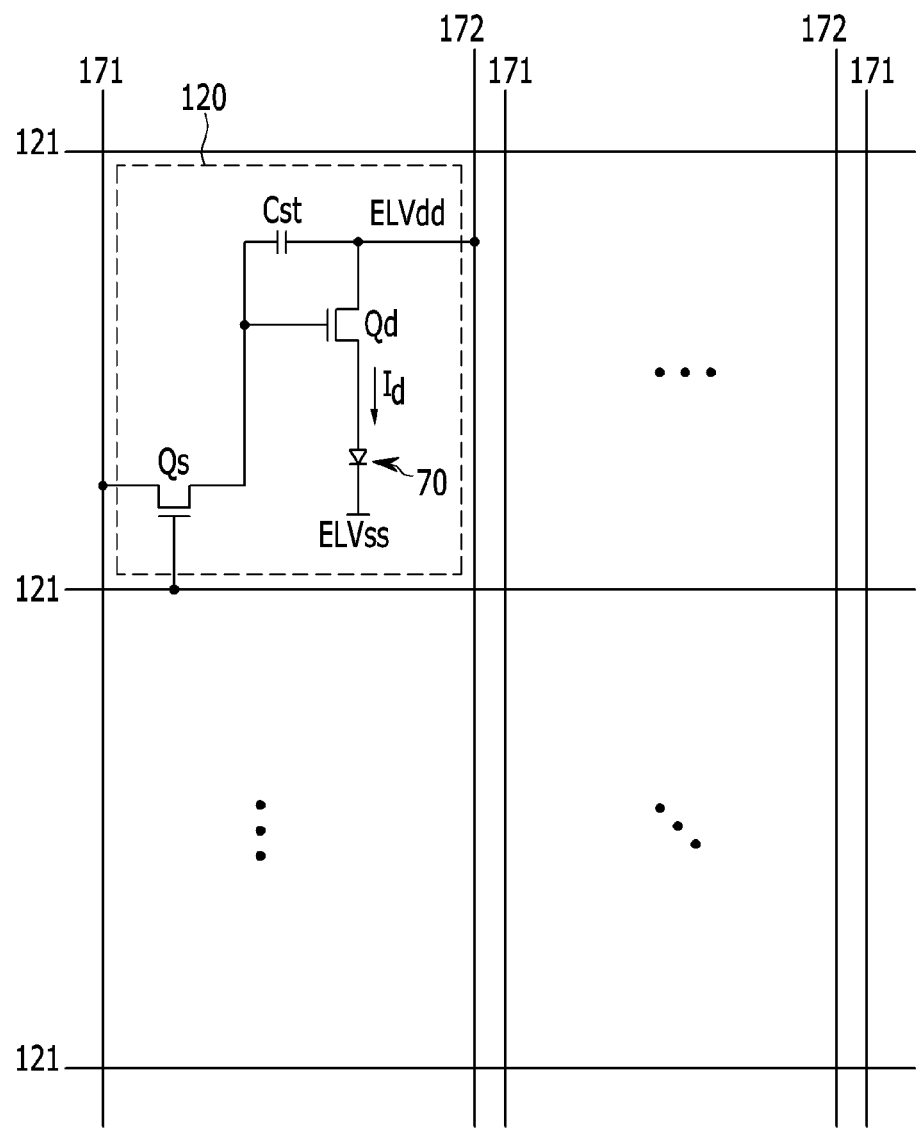
FIG. 8 is an equivalent circuit diagram illustrating one pixel of the organic light emitting display panel according to an exemplary embodiment of the present invention.

FIG. 8 is an equivalent circuit diagram illustrating one pixel of an organic light emitting display panel according to an exemplary embodiment. As illustrated in FIG. 8, the organic light emitting display panel according to the exemplary embodiment includes the plurality of signal lines 121, 171, and 172 and the pixels 120 connected thereto.

The signal lines includes a gate line 121 which transfers the scanning signal, a data line 171 which transfers the data signal, and a driving voltage line 172 which transfers a driving voltage, and the like. The gate line may be a first signal line of FIG. 7 and the data line may be a second signal line of FIG. 7.

The gate lines 121 approximately extend in a row direction and are approximately parallel with each other, and the data lines 171 approximately extend in a column direction and are approximately parallel with each other. The driving voltage line 172 approximately extends in the column direction, but may extend in the row direction or the column direction or may also be formed in a net shape.

One pixel 120 includes a switching transistor Qs, a driving transistor Qd, a capacitor Cst, and an organic light emitting element 70. The switching transistor Qs includes a control terminal, an input terminal, and an output terminal, in which the control terminal is connected to the gate line 121, the input terminal is connected to the data line 171, and the output terminal is connected to the driving transistor Qd. The switching transistor Qs transfers the data signal received from the data line 171 to the driving transistor Qd in response to the scanning signal received from the gate line 121.

The driving transistor Qd also has a control terminal, an input terminal, and an output terminal, in which the control terminal is connected to the switching transistor Qs, the input terminal is connected to the driving voltage line 172, and the output terminal is connected to the organic light emitting element 70. The driving transistor Qd transfers an output current Id of which the magnitude varies depending on a voltage applied between the control terminal and the output terminal.

The capacitor Cst is connected between the control terminal and the input terminal of the driving transistor Qd. The capacitor Cst charges the data signal applied to the control terminal of the driving transistor Qd and maintains the charged data signal even after the switching transistor Qs is turned off.

The organic light emitting element 70 is, for example, an organic light emitting diode (OLED), and includes an anode which is connected to the output terminal of the driving transistor Qd and a cathode which is connected to a common voltage Vss. The organic light emitting element 70 displays an image by emitting light of which the strength varies depending on the output current Id of the driving transistor Qd. The organic light emitting element 70 may include an organic material which uniquely emits light of any one of primary colors such as three primary colors of red, green, and blue, or at least one light, and the organic light emitting diode display displays a desired image by a spatial sum of these colors.

Figure 9:
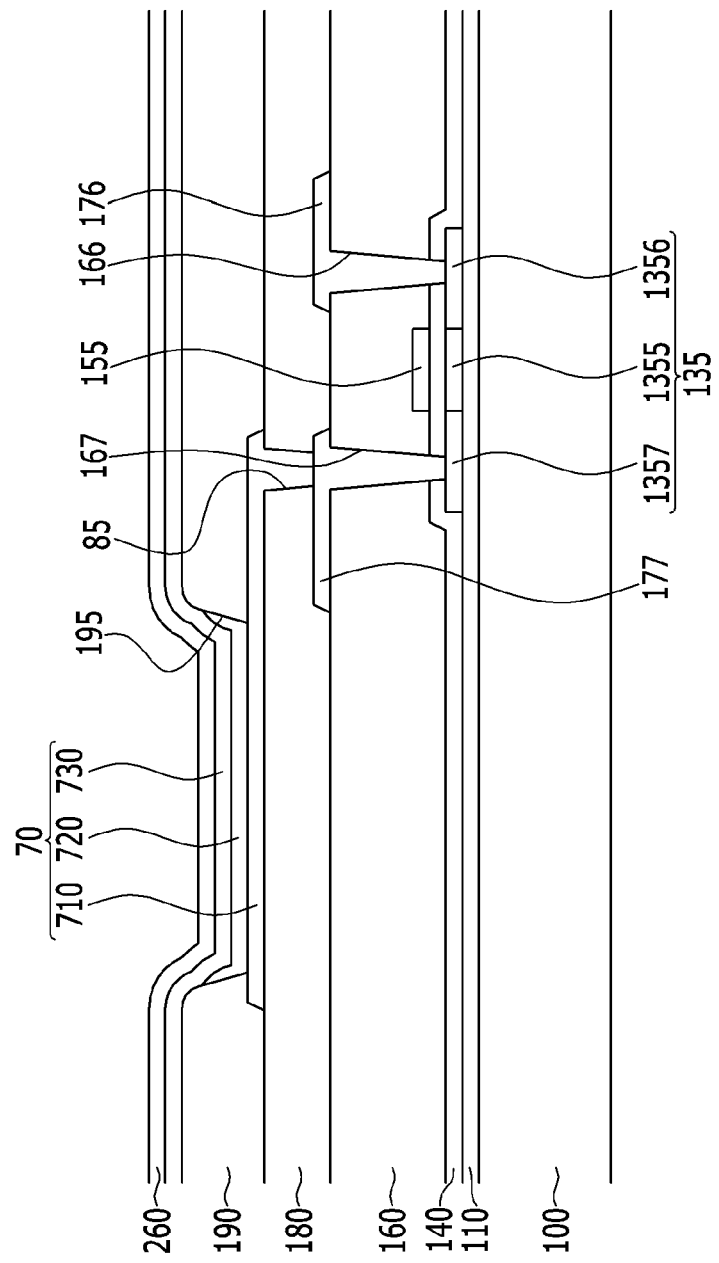
FIG. 9 is a cross-sectional view of one pixel of an organic light emitting diode (OLED) display of FIG. 8.

FIG. 9 is a cross-sectional view of one pixel of an organic light emitting diode (OLED) display of FIG. 8.

A stacked sequence of the driving transistor Qd and the switching transistor Qs is the same, and therefore, in FIG. 9, the driving transistor Qd and the organic light emitting element 70 of FIG. 8 will be mainly described in detail according to the stacking sequence. Hereinafter, the driving thin film transistor Qd is referred to as a thin film transistor.

As illustrated in FIG. 9, the organic light emitting display panel includes the substrate 100, and a buffer layer 110 is formed on the substrate 100. The substrate 100 is the thin film substrate of FIG. 2 and may be an ultrathin glass substrate. The buffer layer 110 may be formed to have a single layer of silicon nitride (SiNx) or a double layer structure in which a silicon nitride (SiNx) layer and a silicon oxide (SiO$_x$) layer are stacked. The buffer layer 110 serves to planarize the surface while preventing infiltration of impurities such as moisture or oxygen.

A semiconductor 135 made of polysilicon is formed on the buffer layer 110. The semiconductor 135 is divided into a channel region 1355, and a source region 1356 and a drain region 1357 which are formed at respective sides of the channel region 1355. The channel region 1355 of the semiconductor is polysilicon which is not doped with an impurity, such as an intrinsic semiconductor. The source region 1356 and the drain region 1357 are polysilicon doped with a conductive impurity and are extrinsic semiconductors. The impurity doped in the source region 1356 and the drain region 1357 may be any one of a p-type impurity and an n-type impurity.

A gate insulating layer 140 is formed on the semiconductor 135. The gate insulating layer 140 may be a single layer or multiple layers including at least one of tetraethyl orthosilicate (TEOS), a silicon nitride, and a silicon oxide.

A gate electrode 155 is formed on the gate insulating layer 140 and overlaps the channel region 1355. The gate electrode 155 may be formed as a single layer or multiple layers including a low resistance material or a material that is resistant to corrosion, such as Al, Ti, Mo, Cu, Ni, or an alloy thereof.

A first interlayer insulating layer 160 is formed on the gate electrode 155. The first interlayer insulating layer 160 may be formed as a single layer or multiple layers including tetraethyl orthosilicate (TEOS), silicon nitride, silicon oxide, or the like, similar to the gate insulating layer 140. The first interlayer insulating layer 160 and the gate insulating layer 140 are perforated by a source contact hole 166 and a drain contact hole 167 through which the source region 1356 and the drain region 1357 are respectively exposed.

A source electrode 176 and a drain electrode 177 are formed on the first interlayer insulating layer 160. The source electrode 176 is connected to the source region 1356 through the contact hole 166 and the drain electrode 177 is connected to the drain region 1357 through the contact hole 167. The source electrode 176 and the drain electrode 177 may be formed as a single layer or as multiple layers including a low resistance material or a material resistant to corrosion, such as Al, Ti, Mo, Cu, Ni, or an alloy thereof. For example, the source electrode 176 and the drain electrode 177 may be a three-layered structure such as of Ti/Cu/Ti, Ti/Ag/Ti, or Mo/Al/Mo.

The gate electrode 155, the source electrode 176, and the drain electrode 177 form the thin film transistor, along with the semiconductor 135. A channel of the thin film transistor is formed in the channel region 1355 of the semiconductor 135 between the source electrode 176 and the drain electrode 177.

A second interlayer insulating layer 180 is formed on the source electrode 176 and the drain electrode 177. The second interlayer insulating layer 180 is perforated by a contact hole 85 through which the drain electrode 177 is exposed. The second interlayer insulating layer 180 may be formed as a single layer or as multiple layers including tetraethyl orthosilicate (TEOS), a silicon nitride, a silicon oxide, or the like, like the first interlayer insulating layer, and may be made of an organic material having a low dielectric constant.

A first electrode 710 is formed on the second interlayer insulating layer 180. The first electrode 710 is electrically connected to the drain electrode 177 through the contact hole 85, and the first electrode 710 may be an anode of the organic light emitting element of FIG. 8.

According to the exemplary embodiment, the second interlayer insulating layer 180 is formed between the first electrode 710 and the drain electrode 177, but the first electrode 710 may instead be formed on the same layer as the drain electrode 177 and may be integrated with the drain electrode 177.

A pixel definition layer 190 is formed on the first electrode 710. The pixel definition layer 190 has an opening 195 through which the first electrode 710 is exposed. The pixel definition layer 190 may be made of a resin such as polyacrylates or polyimides, silica-based inorganic materials, and the like.

An organic emission layer 720 is formed within the opening 195 of the pixel definition layer 190. The organic emission layer 720 is formed in multiple layers including an emission layer and at least one of a hole-injection layer (HIL), a hole-transporting layer (HTL), an electron-transporting layer (ETL), and an electron-injection layer (EIL). When the organic emission layer 720 includes all of the above components, the hole-injection layer (HIL) is disposed on the pixel (or anode) electrode 710, and the hole-transporting layer (HTL), the emission layer, the electron-transporting layer (ETL), and the electron-injection layer (EIL) may be sequentially stacked thereon.

A second electrode 730 is formed on the pixel definition layer 190 and the organic emission layer 720. The second electrode 730 is a cathode of the organic light emitting element. Therefore, the first electrode 710, the organic emission layer 720, and the second electrode 730 form the organic light emitting element 70.

The organic light emitting diode display may have any one structure of a top emission display, a bottom emission display, and a dual emission display depending on the direction in which the organic light emitting element 70 emits light. In the case of the front emission display, the first electrode 710 is formed of a reflective layer and the second electrode 730 is formed of a transflective layer or a transmissive layer. On the other hand, in the case of the bottom emission display, the first electrode 710 is formed of the transflective layer and the second electrode 730 is formed of the reflective layer. Further, in the case of the dual emission display, the first electrode 710 and the second electrode 730 are formed of a transparent layer or a transflective layer.

The reflective layer and the transflective layer are made of an at least one of magnesium (Mg), silver (Ag), gold (Au), calcium (Ca), lithium (Li), chromium (Cr), and aluminum (Al), or an alloy thereof. The electrode is reflective layer or transflective layer based upon a thickness of the layer comprising Mg, Ag, Au, Ca, Li, Cr and/or Al. Specifically, the electrode is transflective if the layer comprising Mg, Ag, Au, Ca, Li, Cr and/or Al is less than 200 nm thick. As the thickness of the layer comprising Mg, Ag, Au, Ca, Li, Cr and/or Al decreases below 200 nm thick, transmittance of light is increased, but when the thickness is too thin, resistance becomes excessive.

The transparent layer is made of a material such as indium tin oxide (ITO), indium zinc oxide (IZO), zinc oxide (ZnO), or indium oxide ($In_2O_3$).

A sealing member 260 is formed on the second electrode 730. The sealing member 260 may include at least one organic layer and one inorganic layer that may be alternately stacked. The organic layer may have a narrower area than that of the inorganic layer, such that the inorganic layer may be formed to completely cover the organic layer.

The organic layer is made of a polymer, and may be a single layer or a stacked layer which is made of any one of polyethylene terephthalate, polyimide, polycarbonate, epoxy, polyethylene, and polyacrylate. More preferably, the organic layer may be made of polyacrylate, and in detail, includes a material in which a monomer composition including a diacrylate-based monomer and a triacrylate-based monomer is polymerized. The monomer composition may further include a monoacrylate-based monomer. Further, the monomer composition may include a known photoinitiator such as TPO (Trimethylbenzoyl-diphenyl-phosphineoxide), but is not limited thereto.

The inorganic layer may be a single layer or a stacked layer including a metal oxide or a metal nitride. In detail, the inorganic layer may include any one of $SiN_x$, $Al_2O_3$, $SiO_2$, and $TiO_2$.

The uppermost layer exposed to the outside in the sealing member 260 may be formed of the inorganic layer to prevent moisture from infiltrating into the organic light emitting element. A halogenated metal layer including LiF may be additionally included between the second electrode 730 and the sealing member 260. The halogenated metal layer may prevent the lower layer from being damaged when the first inorganic layer is formed by a sputtering method or a plasma deposition method.

As illustrated in FIGS. 1 and 5, each display panel 300 is completed by cutting the sealing member 260 and the thin film substrate 100 by using a laser or wheel scribing process, and separating the support substrate 500 from the thin film substrate 100. In this case, since the thin film substrate 100 and the support substrate 500 are strongly coupled with each other by the adsorbing area SB, the display panel 300 is separated by cutting the thin film substrate 100 at a location that corresponds to the desorbing area SA.

According to the exemplary embodiment, when the release layer 10 is formed and then the surface of the adsorbing area SB becomes hydrophilic due to the cleaning, the thin film substrate 100 and the support substrate 500 may be coupled with each other by strong covalent bonding, such that after the thin film substrate 100 is cut into each of the display panels 300, the support substrate 500 may be easily removed from the cut display panels 300.

Meanwhile, according to the related art, the display panel 300 is formed and then the support substrate 500 is separated by a laser ablation technique, such that the transparency of the thin film substrate 100 may be reduced. However, according to the exemplary embodiment, laser ablation is not required to separate the support substrate 500 from the display panels, such that the transparency of the thin film substrate 100 of the display panel may not be reduced.

Hereinafter, a method for manufacturing an organic light emitting display panel according to a second exemplary embodiment will be described. Hereinafter, only characteristic portions differentiated from the first exemplary embodiment of FIG. 1 will be described in detail, and non-described portions are the same as or similar to the first exemplary embodiment of FIG. 1.

Figure 10:
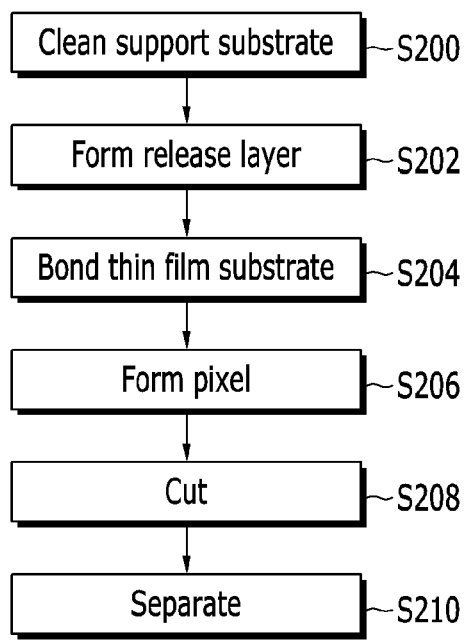
FIG. 10 is a flowchart illustrating a sequence of manufacturing a display panel according to a second exemplary embodiment of the present invention.
Figure 11:
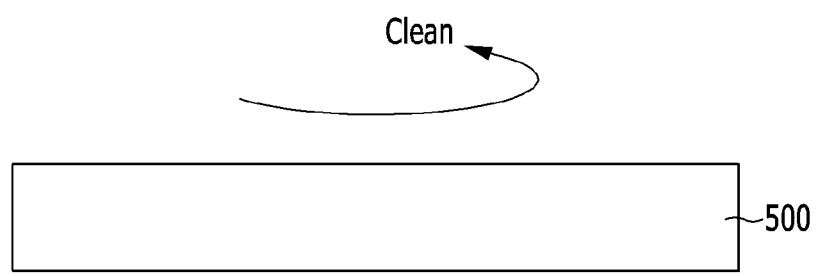
FIG. 11 is a cross-sectional view of the display panel in the intermediate step depending on the sequence of FIG. 10 according to the method of the second exemplary embodiment.

FIG. 10 is a flowchart illustrating a sequence of manufacturing a display panel according to a second exemplary embodiment of the present invention, and FIG. 11 is a cross-sectional view of the display panel in an intermediate step according to the sequence of FIG. 10.

As illustrated in FIG. 10, the method for manufacturing a display panel according to the second exemplary embodiment includes cleaning the support substrate (S200), forming the release layer (S202), bonding the thin film substrate on the support substrate (S204), forming the pixel on the thin film substrate (S206), cutting the thin film substrate into individual display panels (S208), and separating the display panel from the support substrate (S210).

As illustrated in FIG. 11, the support substrate 500 is first cleaned, and then as illustrated in FIG. 2, the release layer 10 is formed, such that the desorbing area SA and the adsorbing area SB are differentiated from each other.

As illustrated in FIG. 11, when the support substrate 500 is cleaned, the entire support substrate 500 has hydrophilicity. Therefore, when the release layer 10 is formed on the support substrate 500 subsequent to the cleaning, the hydrophilic surface is located below the release layer 10, and the thin film substrate 100 contacts the upper surface of the release layer 10 without bonding to the support substrate 500 at locations corresponding to the release layer 10.

Therefore, the thin film substrate 100 is strongly coupled to the support substrate 500 in the adsorbing area SB, but is relatively more weakly coupled with the release layer 10 in the desorbing area SA, such that after the thin film substrate 100 is cut into display panels 300, the display panels may be easily separated from the support substrate 500.

Figure 12:
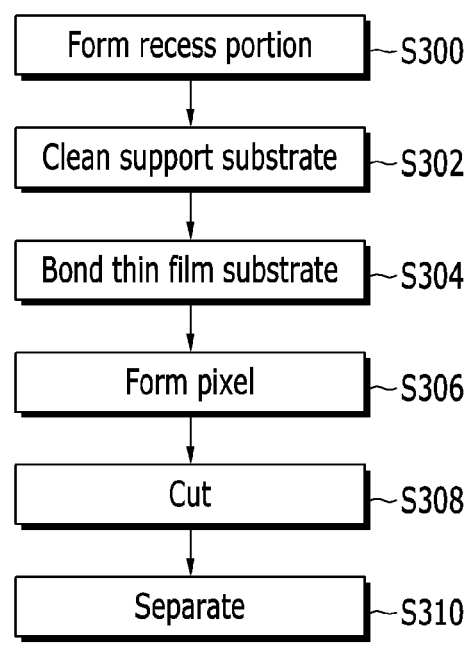
FIG. 12 is a flowchart illustrating a sequence of manufacturing a display panel according to a third exemplary embodiment of the present invention.
Figure 13:
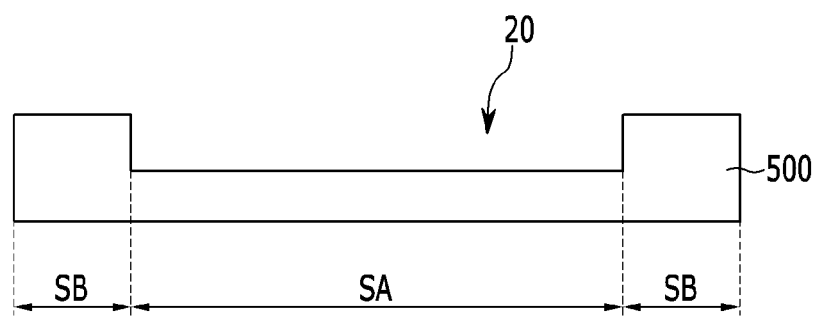
FIG. 13 is a cross-sectional view of the display panel in an intermediate step according to the method of the third exemplary embodiment.

FIG. 12 is a flowchart illustrating a sequence of manufacturing a display panel according to a third exemplary embodiment of the present invention and FIG. 13 is a cross-sectional view of the display panel in an intermediate step according to the sequence of FIG. 12. Hereinafter, only characteristic portions differentiated from the first exemplary embodiment of FIG. 1 will be described in detail, and non-described portions are the same as or similar to the first exemplary embodiment of FIG. 1.

As illustrated in FIG. 12, the method for manufacturing a display panel according to the third exemplary embodiment includes forming a recess portion in the support substrate (S300), cleaning the substrate (S302), bonding the thin film substrate to the support substrate (S304), forming the pixel including the thin film transistor on the thin film substrate (S306), cutting the thin film substrate into individual display panels (S308), and separating the display panels from the support substrate (S310).

That is, according to the third exemplary embodiment of FIG. 12, a detaching recess portion 20 is formed in the support substrate 500 as illustrated in FIG. 13. When the detaching recess portion 20 is formed, a region corresponding to the detaching recess portion becomes the desorbing area SA, and other regions become the adsorbing area SB.

The detaching recess portion 20 may be formed by plasma etching for 300 seconds using $CF_4$ gas or mixed gas of $CF_4$ and Ar, or may be formed by sandblast etching using particles having a size of 1 μm or less.

In this case, a depth of the detaching recess portion 20 may be formed in a range of 2 nm to 200 μm. When the depth of the detaching recess portion is 200 μm or more, the thin film substrate may crack due to the step, and when the depth of the detaching recess portion is 2 nm or less, the detaching may not be facilitated.

As described above, when the recess portion 20 is formed and then the thin film substrate 100 is disposed, the thin film substrate 100 is strongly coupled with the support substrate 500 only in the adsorbing area SB external to the recess, whereas an empty space or a gap is present between the thin film substrate 100 and the support substrate 500 in the desorbing area SA due to the recess portion 20, such that the thin film substrate 100 is not strongly coupled to the support substrate 500 in desorbing area SA. Therefore, after the display panel 300 is formed, the support substrate 500 may be easily separated from the display panel 300.

The third exemplary embodiment describes, by way of example, that the recess portion is formed and then the substrate is cleaned. However, the present invention is in no way so limited, and as with the second embodiment of FIG. 10, a fourth embodiment can be created where the substrate 500 may be cleaned first and then the recess portion 20 may then be formed, such that only the adsorbing area SB may have the hydrophilicity.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

DESCRIPTION OF SYMBOLS

10: Release layer
20: Recess portion
70: Organic light emitting element
85: contact hole
100: Substrate
110: buffer layer
120: Pixel
121: first signal line
135: semiconductor
140: gate insulating layer
155: gate electrode
160: first interlayer insulating layer
166: source contact hole
167: drain contact hole
171: data line
172: driving voltage line
176: source electrode
177: drain electrode
180: second interlayer insulating layer
190: pixel definition layer
195: opening
260: sealing member
300: Display panel
400: Driver
500: Support substrate
710: first electrode
720: organic emission layer
730: second electrode
1355: channel region
1356: source region
1357: drain region

What is claimed is:

1. A method of manufacturing a display panel, comprising:
defining a desorbing area surrounded by an absorbing area in a support substrate by forming one of a release layer and a recess portion in the desorbing area of the support substrate;
cleaning a surface of the support substrate;
disposing a thin film substrate on the support substrate;
bonding directly and covalently the thin film substrate to the absorbing area of the support substrate;
forming a pixel and a sealing member on the thin film substrate;
cutting the sealing member and the thin film substrate at a location that corresponds to the desorbing area; and
separating the support substrate from the thin film substrate.

2. The method of claim 1, wherein the cleaning being achieved by a process selected from a group consisting of UV cleaning, ultrasonic wave cleaning, waterjet cleaning, hydrogen water cleaning, and ozone ($O_3$) cleaning.

3. The method of claim 1, wherein the desorbing area is defined by the recess portion, the recess portion being produced by etching the support substrate via a process selected from plasma etching and sandblasting.

4. The method of claim 3, wherein a depth of the recess portion is 2 nm to 200 μm.

5. The method of claim 1, wherein the desorbing area is defined by the release layer, the forming of the release layer comprises:
forming one of an indium tin oxide (ITO) layer and an indium zinc oxide (IZO) layer on the support substrate;
forming a reserved release layer by patterning the one of the ITO layer and the IZO layer; and
crystallizing the reserved release layer.

6. The method of claim 5, wherein the release layer is formed to have a thickness of 100 Å to 1,000 Å.

7. The method of claim 1, wherein the thin film substrate comprises an ultrathin glass having a thickness of 0.01 mm to 0.1 mm.

8. The method of claim 1, wherein a surface roughness of the support substrate at a location corresponding to the adsorbing area is equal to or less than 0.2 nm.

9. The method of claim 1, wherein the bonding being absent of an intervening adhesive layer.

10. The method of claim 1, wherein the pixel includes an organic light emitting element.

11. A method of manufacturing a display panel, comprising:
cleaning a surface of a support substrate;
defining a desorbing area surrounded by an absorbing area in the support substrate by forming one of a release layer and a recess portion in the desorbing area of the support substrate;
disposing a thin film substrate on the support substrate;
bonding directly and covalently the thin film substrate to the absorbing area of the support substrate;
forming a pixel and a sealing member on the thin film substrate;
cutting the sealing member and the thin film substrate at a location that corresponds to the desorbing area; and
separating the support substrate from the thin film substrate.

12. The method of claim 11, wherein the cleaning comprises a process selected from a group consisting of UV cleaning, ultrasonic wave cleaning, waterjet cleaning, hydrogen water cleaning, and ozone ($O_3$) cleaning, wherein the thin film substrate is bonded to the support substrate without an intervening adhesive layer.

13. The method of claim 11, wherein the desorbing area is defined by the recess portion, the recess portion being produced by etching the support substrate via a process selected from a group consisting of plasma etching and sandblasting.

14. The method of claim 13, wherein a depth of the recess portion is 2 nm to 200 μm.

15. The method of claim 11, wherein the forming of the release layer comprises:
   forming one of an indium tin oxide (ITO) layer and an indium zinc oxide (IZO) layer on the support substrate;
   forming a reserved release layer by patterning the one of the ITO layer and the IZO layer; and
   crystallizing the reserved release layer.

16. The method of claim 15, wherein the release layer is formed to have a thickness of 100 Å to 1000 Å.

17. The method of claim 11, wherein the thin film substrate is an ultrathin glass having a thickness of 0.01 mm to 0.1 mm.

18. The method of claim 11, wherein a surface roughness of the support substrate at a location corresponding to the adsorbing area is equal to or less than 0.2 nm.

19. The method of claim 11, wherein the pixel includes an organic light emitting element.

\* \* \* \* \*